United States Patent
Wang et al.

(10) Patent No.: US 8,901,658 B2
(45) Date of Patent: Dec. 2, 2014

(54) THIN FILM TRANSISTOR

(71) Applicant: E Ink Holdings Inc., Hsinchu (TW)

(72) Inventors: Henry Wang, Hsinchu (TW);
Chia-Chun Yeh, Hsinchu (TW);
Xue-Hung Tsai, Hsinchu (TW);
Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 80 days.

(21) Appl. No.: 13/705,151

(22) Filed: Dec. 4, 2012

(65) Prior Publication Data

US 2013/0200362 A1 Aug. 8, 2013

(30) Foreign Application Priority Data

Feb. 8, 2012 (TW) ............................. 101104104 A

(51) Int. Cl.
*H01L 29/786* (2006.01)
*H01L 29/22* (2006.01)
*H01L 29/417* (2006.01)

(52) U.S. Cl.
CPC ...... *H01L 29/78693* (2013.01); *H01L 29/2206* (2013.01); *H01L 29/41725* (2013.01); *H01L 29/41733* (2013.01); *H01L 29/1869* (2013.01)
USPC .............. 257/353; 257/347; 257/E29.117; 257/E29.273; 257/E29.277; 257/E29.296; 257/E29.29; 257/E29.294; 257/E21.413; 257/E21.414; 438/158; 438/159; 438/161

(58) Field of Classification Search
CPC .................... H01L 29/41733; H01L 29/41725
USPC .................. 438/158, 159, 161; 257/E29.116, 257/E29.117, E29.122, E29.273, E29.277, 257/E29.296, E29.29, E29.294, 288, 347, 257/353
See application file for complete search history.

(56) References Cited

U.S. PATENT DOCUMENTS

| | | | |
|---|---|---|---|
| 5,981,317 A * | 11/1999 | French et al. | 438/161 |
| 6,730,970 B1 | 5/2004 | Katoh et al. | |
| 7,741,640 B2 | 6/2010 | Seo et al. | |
| 7,927,931 B2 | 4/2011 | Yang et al. | |
| 2006/0194500 A1* | 8/2006 | Ishii | 445/24 |
| 2007/0072439 A1* | 3/2007 | Akimoto et al. | 438/795 |
| 2007/0087487 A1* | 4/2007 | Honda | 438/149 |
| 2009/0206338 A1 | 8/2009 | Kim et al. | |
| 2010/0289023 A1 | 11/2010 | Choi et al. | |

FOREIGN PATENT DOCUMENTS

| | | |
|---|---|---|
| TW | 200929546 | 7/2009 |
| TW | 200935521 | 8/2009 |
| TW | 201145505 | 12/2011 |

OTHER PUBLICATIONS

"Office Action of Taiwan Counterpart Application", issued on Dec. 9, 2013, p. 1-p. 6.

* cited by examiner

*Primary Examiner* — Kimberly Rizkallah
*Assistant Examiner* — Maria Ligai
(74) *Attorney, Agent, or Firm* — Jianq Chyun IP Office

(57) ABSTRACT

A thin film transistor (TFT) is provided, which includes a gate, a semiconductor layer, an insulation layer, a source and a drain. The semiconductor layer has a first end and a second end opposite to the first end. The insulation layer is disposed between the gate and the semiconductor layer. The source clamps the first end of the semiconductor layer and the drain clamps the second end of the semiconductor layer.

13 Claims, 1 Drawing Sheet

THIN FILM TRANSISTOR

CROSS-REFERENCE TO RELATED APPLICATION

This application claims the priority benefit of Taiwan application serial no. 101104104, filed on Feb. 8, 2012. The entirety of the above-mentioned patent application is hereby incorporated by reference herein and made a part of this specification.

BACKGROUND OF THE INVENTION

1. Field of the Invention

The invention generally relates to a thin film transistor (TFT), and more particularly, to a TFT with an Ohmic strengthening layer.

2. Description of Related Art

Thanks to the progresses of semiconductor device and display device, the multimedia technology gets quite developed today. In terms of displays, the thin film transistor liquid crystal display (TFT LCD), due to its superior features of high image-quality, good space utilization, low power consumption and no radiation, has gradually played a major role on the display market. Along with more and more popular applications of the TFT LCD products (such as TV set, mobile phone, digital camera, laptop computer, and so on), these devices have gradually increased impact on our daily life.

However, in response to the energy-saving demand today, how to further reduce the power consumption of a TFT LCD through changing and improving the semiconductor devices in the TFT LCD meanwhile keeping high image-quality and high performance has become the development trend for the future. In order to reduce the power consumption, some schemes to improve the Ohmic contact resistance of the semiconductor layer and the source (or the drain) of a TFT have been provided today. For example, in the related art, there is a scheme of reducing the Ohmic contact resistance by disposing an Ohmic contact layer on the contact surfaces of the semiconductor layer and the source (or the drain). However, the above-mentioned improvement is still limited, and the effect of improving the power consumption at the present stage is going on.

SUMMARY OF THE INVENTION

Accordingly, the invention is directed to a TFT with low power consumption.

An embodiment of the invention provides a TFT, which includes a gate, a semiconductor layer, an insulation layer, a source and a drain. The semiconductor layer has a first end and a second end opposite to the first end. The insulation layer is disposed between the gate and the semiconductor layer. The source clamps the first end of the semiconductor layer and the drain clamps the second end of the semiconductor layer.

Based on the description above, the TFT of an embodiment of the invention can utilizes the source and the drain to respectively clamp both ends of the semiconductor layer to accomplish Ohmic contacts so as to increase the Ohmic contact area, thereby effectively reducing the operation voltage and the power consumption.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
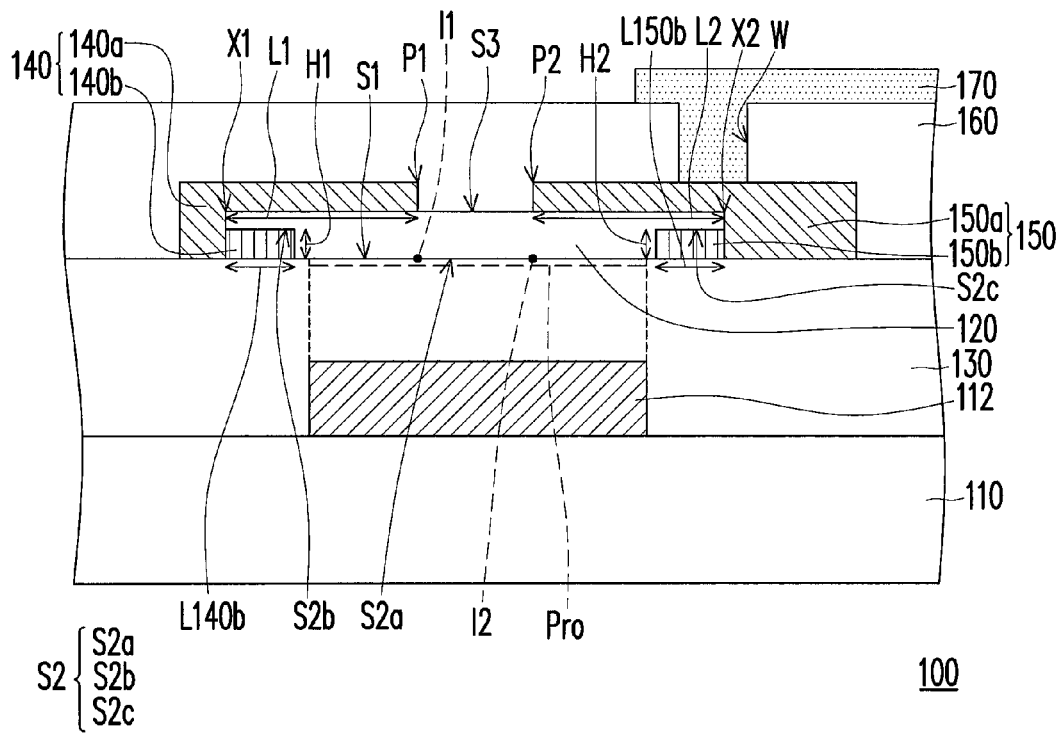
FIG. 1 is a schematic cross-sectional diagram of a TFT according to an embodiment of the invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a schematic cross-sectional diagram of a TFT according to an embodiment of the invention. Referring to FIG. 1, a TFT 100 in this embodiment includes a gate 112, a semiconductor layer 120, an insulation layer 130, a source 140 and a drain 150. The semiconductor layer 120 has a first end X1 and a second end X2 opposite to the first end X1. In addition, the material of the semiconductor layer 120 is for example, metal-oxide semiconductor. In more details, the material of the semiconductor layer 120 includes indium zinc oxide (IZO), zinc oxide (ZnO), aluminium doped zinc oxide (AZO), indium gallium zinc oxide (IGZO) or a combination thereof.

The insulation layer 130 is disposed between the gate 112 and the semiconductor layer 120. In addition, the material of the insulation layer 130 is, for example, silicon oxide or silicon nitride with high dielectric constant. The insulation layer 130 has a first surface S1 facing away from the gate 112 and the semiconductor layer 120 has a second surface S2 facing the gate 112.

In the embodiment, the source 140 clamps the first end X1 of the semiconductor layer 120 and the drain 150 clamps the second end X2 of the semiconductor layer 120. The source 140 has a first electrode portion 140a and a second electrode portion 140b. In more details, the first electrode portion 140a is connected to the first end X1 of the semiconductor layer 120 and the second electrode portion 140b is connected to the first electrode portion 140a and the first end X1 of the semiconductor layer 120, in which at least a part of the second electrode portion 140b is disposed between the first surface S1 and the second surface S2. The drain 150 has a third electrode portion 150a and a fourth electrode portion 150b. In more details, the third electrode portion 150a is connected to the second end X2 of the semiconductor layer 120 and the fourth electrode portion 150b is connected to the third electrode portion 150a and the second end X2 of the semiconductor layer 120, in which at least a part of the fourth electrode portion 150b is disposed between the first surface S1 and the second surface S2.

In the embodiment, the gate 112, the first electrode portion 140a and the third electrode portion 150a are made of, for example, molybdenum (Mo), aluminium (Al), titanium (Ti) or an alloy thereof or a metal laminated layer thereof. The second electrode portion 140b and the fourth electrode portion 150b are made of, for example, metal, metal oxide, or a combination thereof. In more details, the material of the second electrode portion 140b and the fourth electrode portion 150b includes molybdenum-chrome alloy, aluminium-molybdenum alloy, molybdenum, copper, indium tin oxide or a combination thereof In the embodiment, the material of the second electrode portion 140b and the fourth electrode portion 150b may be similar to the material of the first electrode portion 140a and the third electrode portion 150a, which the invention is not limited to. Each of the thickness H1 of the second electrode portion 140b and the thickness H2 of the fourth electrode portion 150b ranges, for example, from 2 nm to 300 nm. In the embodiment, each of the thickness H1 of the second electrode portion 140b and the thickness H2 of the fourth electrode portion 150b ranges, for example, from 10 nm to 100 nm.

The second surface S2 of the semiconductor layer 120 includes a sub-surface S2a, a sub-surface S2b and a sub-surface S2c, in which the sub-surface S2b and the sub-surface S2c are respectively located at the two opposite ends of the sub-surface S2a, the sub-surface S2b is located at the first end X1 and the sub-surface S2c is located at the second end X2. In the embodiment, the second electrode portion 140b is located between the sub-surface S2b and the first surface S1. In addition, the fourth electrode portion 150b is located between the sub-surface S2c and the first surface S1.

In more details, the semiconductor layer 120, for example, has a third surface S3 facing away from the gate 112. The first electrode portion 140a extends to a first position P1 from the first end X1 toward the third electrode portion 150a along the third surface S3, and the third electrode portion 150a extends to a second position P2 from the second end X2 toward the first electrode portion 140a along the third surface S3. The overlapped length L1 between the first electrode portion 140a and the semiconductor layer 120 in the embodiment (i.e., the length from X1 to P1) is, for example, greater than the length L140b of the second electrode portion 140b, and the overlapped length L2 between the third electrode portion 150a and the semiconductor layer 120 (i.e., the length from X2 to P2) is, for example, greater than the length L150b of the fourth electrode portion 150b. In addition, a first orthogonal projection I1 of the first position P1 onto the first surface S1 is located between the second electrode portion 140b and a second orthogonal projection 12 of the second position P2 onto the first surface 51. The second orthogonal projection 12 is located between the first orthogonal projection I1 and the fourth electrode portion 150b. The second electrode portion 140b, the first orthogonal projection I1, the second orthogonal projection 12 and the fourth electrode portion 150b are separated from each other.

It can be seen that the second electrode portion 140b, the fourth electrode portion 150b, the first electrode portion 140a and the third electrode portion 150a clamp the semiconductor layer 120 like a sandwich structure. It should be noted that since for the metallic material (the material of the second electrode portion 140b, the fourth electrode portion 150b, the first electrode portion 140a and the third electrode portion 150a) or the metal-oxide material (for example, indium tin oxide), the metal-oxide semiconductor (the material of the semiconductor layer 120) has excellent Ohmic contact, so that the embodiment may not need to dispose an Ohmic contact layer between the source 140 (or the drain 150) and the semiconductor layer 120. In the embodiment, the TFT 100 uses the sandwich structure to increase the contact areas between the metal-oxide semiconductor and the source 140 and between the metal-oxide semiconductor and the drain 150, which increases the Ohmic contact area so as to increase the channel width. In other words, the carriers in this case can be transmitted not only through the third surface S3 between the first electrode portion 140a and the third electrode portion 150a, but also through the second surface S2 between the second electrode portion 140b and the fourth electrode portion 150b. In this way, the channel width is increased, the transmitted current is thereby advanced, and moreover the operation voltage and the power consumption of the TFT 100 are accordingly reduced.

The TFT 100 of the embodiment further includes a substrate 110, a protection layer 160 and a conductive material 170. The gate 112 is disposed between the substrate 110 and the semiconductor layer 120. The protection layer 160 covers the first electrode portion 140a, the semiconductor layer 120 and the third electrode portion 150a, in which the protection layer 160 has a through-hole W and the through-hole W exposes at least a part of the drain 150. In the embodiment, the through-hole W exposes, for example, at least a part of the third electrode portion 150a. In addition, the conductive material 170 is filled into the through-hole W and covers a part of the protection layer 160, so that the conductive material 170 is electrically connected to the drain 150.

It should be noted that in order to reduce the influence of the parasitic capacitance on a TFT in the prior art and further advance the charged and discharged speed of the conductive material 170, in the embodiment, the orthogonal projection Pro of the gate 112 onto the second surface S2 is not overlapped with the second electrode portion 140b and the fourth electrode portion 150b. In other words, the first electrode portion 140a and the third electrode portion 150a are partially overlapped with the gate 112 in the direction perpendicular to the first surface S1, while the second electrode portion 140b and the fourth electrode portion 150b are not overlapped with the gate 112 in the direction perpendicular to the first surface S1.

Since both the materials of the second electrode portion 140b (or the fourth electrode portion 150b) and the first electrode portion 140a (or the third electrode portion 150a) are metal, when applying a voltage, the second electrode portion 140b (or the fourth electrode portion 150b) may have a voltage level close to the voltage level of the first electrode portion 140a (or the third electrode portion 150a). In this regard, to avoid an increased parasitic capacitance caused by a too close distance between the gate 112 and the second electrode portion 140b (or the fourth electrode portion 150b), the second electrode portion 140b and the fourth electrode portion 150b can be optionally disposed at the two opposite sides of the orthogonal projection Pro so as to increase the distance between the gate 112 and the second electrode portion 140b (or the fourth electrode portion 150b), which can effectively reduce the parasitic capacitance, increase the charged and discharged speed of the conductive material 170 and thus obtain a better image quality.

Figure 2:
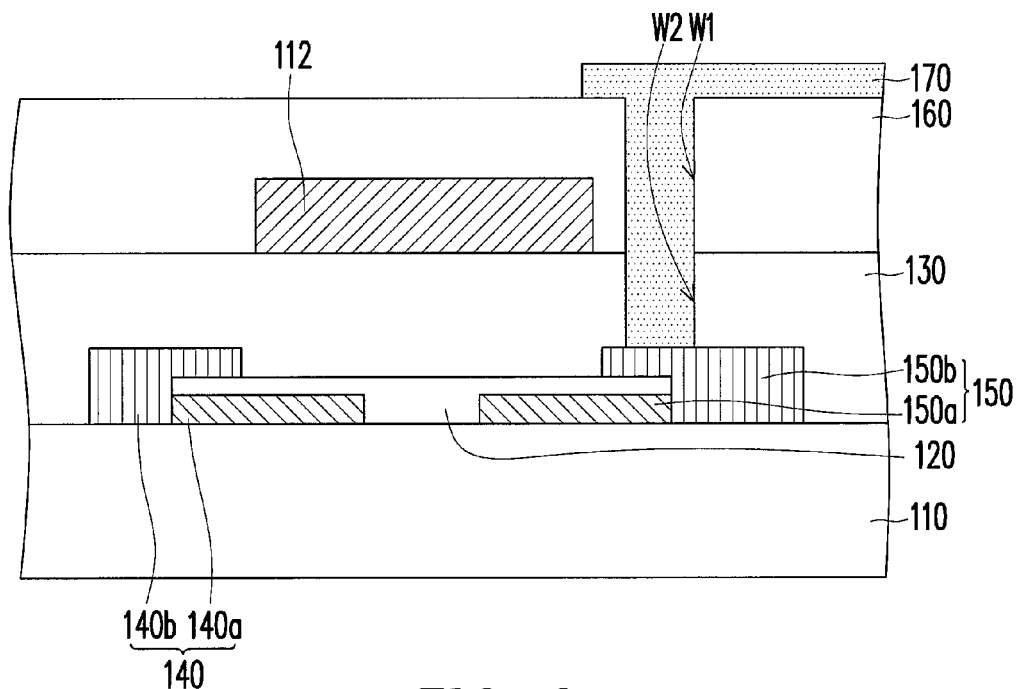
FIG. 2 is a schematic cross-sectional diagram of a TFT according to another embodiment of the invention.

In addition to the above staggered structure TFT 100, the TFT of an embodiment of the invention may be the one with co-planner structure. FIG. 2 is a schematic cross-sectional diagram of a TFT according to another embodiment of the invention.

Referring to FIG. 2, the TFT 200 of the embodiment has similar layers to those of the TFT 100 of FIG. 1, in which the similar film layers have the similar materials and the similar functions, which is omitted to describe. The difference between the TFTs of FIG. 2 and FIG. 1 lies in the stacking sequence of the film layers. In the embodiment, the source 140 and the drain 150 are disposed on the substrate 110, the semiconductor layer 120 is disposed on the first electrode portion 140a and the third electrode portion 150a, and the second electrode portion 140b and the fourth electrode portion 150b respectively cover parts of the semiconductor layer 120 and are respectively connected to the side-edges of the first electrode portion 140a and the third electrode portion 150a. In addition, the insulation layer 130 is disposed at a side of the first electrode portion 140a and the third electrode portion 150a away from the substrate 110, while the gate 112 is located between the insulation layer 130 and the protection layer 160. In addition, the TFT 200 of the embodiment also includes the protection layer 160 and the conductive material 170. The protection layer 160 covers the gate 112 and the insulation layer 130. The protection layer 160 has a first through-hole W1 and the insulation layer 130 has a second through-hole W2, in which the first through-hole W1 and the second through-hole W2 are communicated with each other and expose at least a part of the drain 150. In the embodiment, the first through-hole W1 and the second through-hole W2 expose, for example, at least a part of the fourth electrode portion 150b. The conductive material 170 is filled into the first through-hole W1 and the second through-hole W2 and covers a part of the protection layer 160, so that the conductive material 170 is electrically connected to the drain 150. The conductive material 170 in the embodiment is connected to the semiconductor layer 120 and the third electrode portion 150a through the fourth electrode portion 150b.

In summary, the TFT provided by the embodiments of the invention uses a sandwich structure (i.e., a structure to clamp the semiconductor layer between the first electrode portion and the second electrode portion and between the third electrode portion and the fourth electrode portion) to increase the contact areas between the metal-oxide semiconductor and the source and between the metal-oxide semiconductor and the drain, which increases the Ohmic contact area so as to increase the channel width and advance the transmission current under a same device area. Further, the above-mentioned scheme can reduce the operation voltage and the TFT power consumption. In addition, by improving the design of the positions between the gate and the second electrode portion and between the gate and the fourth electrode portion, the parasitic capacitance is effectively reduced, which further advances the charged and discharged speed of the conductive material to enable the display employing the TFTs having a higher frame update frequency.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A thin film transistor, comprising:
   a gate;
   a semiconductor layer, having a first end and a second end opposite to the first end;
   an insulation layer, disposed between the gate and the semiconductor layer and having a first surface facing away from the gate, wherein the semiconductor layer has a second surface facing the gate and a third surface facing away from the gate;
   a source, clamping the first end of the semiconductor layer and the source having:
      a first electrode portion, connected to the first end of the semiconductor layer and disposed on the third surface; and
      a second electrode portion, connected to the first electrode portion and the first end of the semiconductor layer, wherein at least a part of the second electrode portion is disposed between the first surface and the second surface; and
   a drain, clamping the second end of the semiconductor layer and the drain having:
      a third electrode portion, connected to the second end of the semiconductor layer and disposed on the third surface; and
      a fourth electrode portion, connected to the third electrode portion and the second end of the semiconductor layer, wherein at least a part of the fourth electrode portion is disposed between the first surface and the second surface,
   wherein an orthogonal projection of the gate onto the second surface and the second electrode portion are not overlapped with each other, the orthogonal projection of the gate onto the second surface and the fourth electrode portion are not overlapped with each other, the orthogonal projection of the gate onto the second surface and the first electrode portion are overlapped with each other, and the orthogonal projection of the gate onto the second surface and the third electrode portion are overlapped with each other.

2. The thin film transistor as claimed in claim 1, wherein the second electrode portion and the fourth electrode portion are respectively located at two opposite sides of the orthogonal projection of the gate onto the second surface.

3. The thin film transistor as claimed in claim 1, wherein the first electrode portion extends to a first position from the first end toward the third electrode portion along the third surface, the third electrode portion extends to a second position from the second end toward the first electrode portion along the third surface, a first orthogonal projection of the first position onto the first surface is located between the second electrode portion and a second orthogonal projection of the second position onto the first surface, the second orthogonal projection is located between the first orthogonal projection and the fourth electrode portion, and the second electrode portion, the first orthogonal projection, the second orthogonal projection and the fourth electrode portion are separated from each other.

4. The thin film transistor as claimed in claim 1, wherein a thicknesses of each of the second electrode portion and the fourth electrode portion ranges from 2 nm to 300 nm.

5. The thin film transistor as claimed in claim 4, wherein the thicknesses of each of the second electrode portion and the fourth electrode portion ranges from 10 nm to 100 nm.

6. The thin film transistor as claimed in claim 1, wherein material of the second electrode portion and the fourth electrode portion is metal, metal oxide, or a combination thereof.

7. The thin film transistor as claimed in claim 6, wherein the material of the second electrode portion and the fourth electrode portion comprises molybdenum-chrome alloy, aluminium-molybdenum alloy, molybdenum, copper, indium tin oxide or a combination thereof.

8. The thin film transistor as claimed in claim 1, wherein material of the semiconductor layer is metal-oxide semiconductor.

9. The thin film transistor as claimed in claim 8, wherein the metal-oxide semiconductor comprises indium zinc oxide (IZO), zinc oxide (ZnO), aluminium doped zinc oxide (AZO), indium gallium zinc oxide (IGZO) or a combination thereof.

10. The thin film transistor as claimed in claim 1, further comprising a substrate, wherein the gate is disposed between the substrate and the semiconductor layer.

11. The thin film transistor as claimed in claim 10, further comprising:
   a protection layer, covering the source, the semiconductor layer and the drain, wherein the protection layer has a through-hole and the through-hole exposes at least a part of the drain; and
   a conductive material, filled into the through-hole and covering a part of the protection layer.

12. The thin film transistor as claimed in claim 1, further comprising a substrate, wherein the semiconductor layer is disposed between the substrate and the gate.

13. The thin film transistor as claimed in claim 12, further comprising:
- a protection layer, covering the gate and the insulation layer, wherein the protection layer has a first through-hole, the insulation layer has a second through-hole, and the first through-hole and the second through-hole are communicated with each other and expose at least a part of the drain; and
- a conductive material, filled into the first through-hole and the second through-hole and covering a part of the protection layer.

* * * * *